(12) United States Patent
Schnetzka et al.

(10) Patent No.: US 7,746,020 B2
(45) Date of Patent: Jun. 29, 2010

(54) COMMON MODE & DIFFERENTIAL MODE FILTER FOR VARIABLE SPEED DRIVE

(75) Inventors: Harold R. Schnetzka, York, PA (US); Ivan Jadric, York, PA (US); Shreesha Adiga Manoor, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 326 days.

(21) Appl. No.: 11/931,993

(22) Filed: Oct. 31, 2007

(65) Prior Publication Data

US 2008/0174255 A1 Jul. 24, 2008

Related U.S. Application Data

(60) Provisional application No. 60/885,932, filed on Jan. 22, 2007.

(51) Int. Cl.
*G05D 23/275* (2006.01)
(52) U.S. Cl. .................. 318/632; 318/611; 318/629; 333/178
(58) Field of Classification Search ................ 333/178; 318/632, 611, 629
See application file for complete search history.

(56) References Cited

U.S. PATENT DOCUMENTS

| | | | |
|---|---|---|---|
| 3,593,103 A | | 7/1971 | Chandler et al. |
| 3,859,542 A | * | 1/1975 | Kennedy .................... 307/401 |
| 4,308,491 A | | 12/1981 | Joyner, Jr. et al. |
| 4,587,474 A | | 5/1986 | Espelage et al. |
| 4,758,771 A | | 7/1988 | Saito et al. |
| 4,973,915 A | * | 11/1990 | Batey ......................... 330/151 |

(Continued)

FOREIGN PATENT DOCUMENTS

DE 102004052700 A1 5/2006

(Continued)

OTHER PUBLICATIONS

Manjrekar M D et al: "An auxiliary zero state synthesizer to reduce common mode voltage in three-phase inverters" Industry Applications Conference, 1999. Thirty-Fourth IAS Annual meeting Conference Record of the 1999 IEEE Phoenix, AZ, USA Oct. 3-7, 1999, Piscataway, NJ, USA, IEEE, US, vol. 1, Oct. 3, 1999, pp. 54-59, XP010355205 ISBN: 978-0-7803-5589-7.

(Continued)

*Primary Examiner*—Rina I Duda
(74) *Attorney, Agent, or Firm*—McNees Wallace & Nurick, LLC

(57) ABSTRACT

Systems and methods for improved Variable Speed Drives having active inverters include an input filter for filtering common mode and differential mode currents. A three-phase inductor has three windings, each winding of the three-phase inductor having a center tap dividing each winding into a pair of inductor sections; and a three-phase input capacitor bank connected in a wye configuration to the three center taps at one end, and to a common point at the opposite end. The three-phase input capacitor bank provides a short circuit for frequencies above a predetermined fundamental frequency for shunting such frequencies through the three phase capacitor bank, while passing the predetermined fundamental frequency to an input AC power source.

9 Claims, 7 Drawing Sheets

U.S. PATENT DOCUMENTS

| | | | |
|---|---|---|---|
| 5,081,368 A | 1/1992 | West | |
| 5,123,080 A | 6/1992 | Gillett et al. | |
| 5,127,085 A | 6/1992 | Becker et al. | |
| 5,298,848 A | 3/1994 | Ueda et al. | |
| 5,410,230 A | 4/1995 | Bessler et al. | |
| 5,592,058 A | 1/1997 | Archer et al. | |
| 5,646,458 A | 7/1997 | Bowyer et al. | |
| 5,747,955 A | 5/1998 | Rotunda et al. | |
| 5,796,234 A | 8/1998 | Vrionis | |
| 5,869,946 A | 2/1999 | Carobolante | |
| 5,936,855 A | 8/1999 | Salmon | |
| 5,949,664 A * | 9/1999 | Bernet et al. | 363/37 |
| 5,969,966 A | 10/1999 | Sawa et al. | |
| 5,982,646 A * | 11/1999 | Lyons et al. | 363/58 |
| 6,005,362 A | 12/1999 | Enjeti et al. | |
| 6,072,302 A | 6/2000 | Underwood et al. | |
| 6,118,676 A | 9/2000 | Divan et al. | |
| 6,160,722 A | 12/2000 | Thommes et al. | |
| 6,239,513 B1 | 5/2001 | Dean et al. | |
| 6,276,148 B1 | 8/2001 | Shaw | |
| 6,301,130 B1 * | 10/2001 | Aiello et al. | 363/37 |
| 6,313,600 B1 | 11/2001 | Hammond et al. | |
| 6,348,775 B1 | 2/2002 | Edelson et al. | |
| 6,487,096 B1 | 11/2002 | Gilbreth et al. | |
| 6,559,562 B1 | 5/2003 | Rostron | |
| 6,686,718 B2 | 2/2004 | Jadric et al. | |
| 6,768,284 B2 | 7/2004 | Lee et al. | |
| 6,801,019 B2 | 10/2004 | Haydock et al. | |
| 7,081,734 B1 | 7/2006 | Jadric et al. | |
| 7,116,076 B2 | 10/2006 | Sippola et al. | |
| 7,402,983 B2 * | 7/2008 | Jacobson et al. | 323/214 |
| 7,629,836 B2 | 12/2009 | Kull et al. | |
| 7,659,797 B2 | 2/2010 | Tucker | |
| 7,667,988 B2 | 2/2010 | Haeberle et al. | |
| 2002/0195973 A1 | 12/2002 | Hu et al. | |
| 2003/0015873 A1 | 1/2003 | Khalizadeh et al. | |
| 2003/0052544 A1 | 3/2003 | Yamamoto et al. | |
| 2005/0057210 A1 | 3/2005 | Ueda et al. | |
| 2005/0068001 A1 | 3/2005 | Skaug et al. | |
| 2007/0063668 A1 | 3/2007 | Schnetzke et al. | |

FOREIGN PATENT DOCUMENTS

| | | |
|---|---|---|
| DE | 102005005688 A1 | 8/2006 |
| EP | 0272776 A2 | 6/1988 |
| EP | 0283954 A2 | 9/1988 |
| EP | 0422221 A1 | 11/1989 |
| EP | 1300937 A2 | 4/2003 |
| EP | 0313366 A2 | 8/2008 |
| JP | 06105563 | 9/1992 |
| JP | 05068376 | 3/1993 |
| JP | 2002176767 | 6/2002 |
| JP | 04026374 | 9/2006 |
| WO | 9314559 A1 | 7/1993 |
| WO | 9732168 A1 | 9/1997 |
| WO | 0062396 A | 10/2000 |
| WO | 03094334 A | 11/2003 |

OTHER PUBLICATIONS

Annabelle Van Zyl, Rene Spee, Alex Faveluke, and Shibashis Bhowmik; Voltange Sag Ride-Through for Adjustable-Speed Drives With Active Rectifiers; Nov./Dec. 1998; vol. 34, Issue No. 6; IEEE Transactions on Industry Applications.

Annette Von Jouanne, Prasad N. Enjeti, and Basudeb Banerjee; Assessment of Ride-Through Alternatives for Adjustable-Speed Drives; Jul./Aug. 1999; vol. 35, Issue No. 4; IEEE Transactions on Industry Applications.

"Output filter for motor drives", Schaffner, www.schaffner.com, May 2006.

"Sine wave output filter for motor drive", Schaffner, www.schaffner.com, May 2006.

"Sine wave and EMC output filter for motor drives with a voltage dc link", Schaffner, www.schaffner.com, May 2006.

"Sine wave output filter for high-speed motor drives", Schaffner, www.schaffner.com, May 2006.

"Add-on sine wave output filter module for common mode voltage improvement", Schaffner, www.schaffner.com, May 2006.

"Three-phase harmonics and EMC filter", Schaffner, www.schaffner.com, May 2006.

Muetze, Annette, "Bearing Currents in Inverter-Fed AC Motors," PhD dissertation, Elektrotechnik und Informationstechnik det Technischen Universitaet Darmstadt, Feb. 2, 1974.

* cited by examiner

COMMON MODE & DIFFERENTIAL MODE FILTER FOR VARIABLE SPEED DRIVE

CROSS REFERENCES TO RELATED APPLICATIONS

This patent application claims the benefit of U.S. Provisional Patent Application No. 60/885,932, filed Jan. 22, 2007, for which priority is claimed.

BACKGROUND

The present application relates generally to variable speed drives. The application relates more specifically to a common mode & differential mode filter for a variable speed drive incorporating an active converter.

A variable speed drive (VSD) for heating, ventilation, air-conditioning and refrigeration (HVAC&R) applications typically includes a rectifier or converter, a DC link, and an inverter. VSDs that incorporate active converter technology to provide power factor correction and reduced input current harmonics also generate a significantly higher level of common mode RMS and peak to peak voltage to the motor stator windings as compared to conventional VSDs. This common mode voltage can cause motor and compressor bearing fluting, and these common mode voltages which result in currents flowing through the machine bearings may cause premature bearing failures in the motor and/or compressor.

Proper operation of the active converter control methodology, using the synchronous d-q reference frame requires knowledge of the instantaneous phase angle of the input line-to-line voltage. If the reference frame angle is incorrect or unknown, then the input power factor and the harmonic distortion of the input current to the Variable Speed Drive (VSD) with active converter cannot be controlled properly. If the VSD is required to ride-through an extended loss of the input line-to-line voltage and re-synchronize to the input mains when the power is restored, a means to retain the expected d-q reference frame angle during the loss of mains is needed. In addition, a means to quickly lock back onto the input mains line-to-line voltage and generate the actual phase angle of the line-to-line voltage is required. What is needed is a system and/or method that satisfy one or more of these needs or provides other advantageous features. While the present invention is directed specifically to VSDs that incorporate an Active Converter type AC to DC converter topology, the invention is also effective for VSDs utilizing conventional AC to DC rectifier converters.

Other features and advantages will be made apparent from the present specification. The teachings disclosed extend to those embodiments that fall within the scope of the claims, regardless of whether they accomplish one or more of the aforementioned needs.

SUMMARY

The present invention is directed to a circuit for application on three-phase Pulse Width Modulated (PWM) Variable Speed Drives (VSDs), and preferably for application on PWM VSDs having Active Converter topologies.

In one embodiment, a variable speed drive system is configured to receive an input AC power at a fixed AC input voltage magnitude and frequency and provide an output AC power at a variable voltage and variable frequency. The variable speed drive includes a converter stage connected to an AC power source providing the input AC voltage. The converter stage is configured to convert the input AC voltage to a boosted DC voltage. A DC link is connected to the converter stage, the DC link configured to filter and store the boosted DC voltage from the converter stage. An inverter stage is connected to the DC link, the inverter stage configured to convert the boosted DC voltage from the DC link into the output AC power having the variable voltage and the variable frequency. Finally, an input filter is connected to the VSD at the input to the converter stage for filtering a common mode component and a differential mode component induced by conducted electromagnetic interference or radio frequency interference present at the AC power source.

Another embodiment relates to an input filter for filtering common mode and differential mode currents. The input filter includes a three-phase inductor having three windings. Each winding of the three-phase inductor includes a center tap dividing each winding into a pair of inductor sections. A three-phase input capacitor bank of three capacitors is connected in a wye configuration to the three center taps at one end, and to a common point at the opposite end. The three-phase input capacitor bank is configured to substantially provide a short circuit for frequencies above a predetermined fundamental frequency for shunting frequencies above a predetermined fundamental frequency through the three phase capacitor bank, while passing the predetermined fundamental frequency to the mains.

A further embodiment relates to an output filter for filtering common mode and differential mode currents associated with a variable speed drive. The output filter includes a first output capacitor bank of three capacitors. Each capacitor of the first output capacitor bank is connected in a wye configuration to an output phase of the inverter stage. The three capacitors of the first output capacitor bank are each connected in common at a common capacitor connection at an end opposite the output phase connection. The common capacitor connection is also connected to earth.

Still another embodiment, is directed to a chiller system. The chiller system includes a refrigerant circuit comprising compressor, a condenser, and an evaporator connected in a closed refrigerant loop. A motor is connected to the compressor to power the compressor. A variable speed drive is connected to the motor. The variable speed drive is configured to receive an input AC power at a fixed AC input voltage magnitude and frequency and provide an output AC power at a variable voltage and variable frequency. The variable speed drive includes a converter stage connected to an AC power source providing the input AC voltage. The converter stage is configured to convert the input AC voltage to a boosted DC voltage. A DC link is connected to the converter stage, with the DC link configured to filter and store the boosted DC voltage from the converter stage. An inverter stage is connected to the DC link, with the inverter stage configured to convert the boosted DC voltage from the DC link into the output AC power having the variable voltage and the variable frequency. Finally, an input filter for filtering common mode and differential mode currents is connected to the variable speed drive at an input to the converter stage. The input filter includes a three-phase inductor having three windings, wherein each winding of the three-phase inductor has a center tap dividing each winding into a pair of inductor sections, and a three-phase input capacitor bank having three capacitors connected in a wye configuration to the three center taps at one end, and to a common point at the opposite end. The three-phase input capacitor bank is configured to substantially provide a short circuit for frequencies above a predetermined fundamental frequency for shunting frequencies above a predetermined fundamental frequency through the three phase capacitor bank, while passing the predetermined fundamental frequency to the converter stage.

One advantage is to reduce the common mode and differential mode currents associated with conducted electromagnetic interference and radio frequency interference present at the AC power source as a result of the operation of the VSD.

A second advantage is to reduce the common mode voltage stress presented to the motor stator in both RMS and peak terms, thereby alleviating issues associated with premature machine bearing failure and premature insulation to earth ground failure.

Another advantage is to reduce the differential mode voltage stress presented to the motor stator in both RMS and peak terms, thereby alleviating issues associated with premature machine turn-to-turn stator winding failure.

Alternative exemplary embodiments relate to other features and combinations of features as may be generally recited in the claims.

BRIEF DESCRIPTION OF THE FIGURES

The application will become more fully understood from the following detailed description, taken in conjunction with the accompanying figures, wherein like reference numerals refer to like elements, in which.

DETAILED DESCRIPTION OF THE EXEMPLARY EMBODIMENTS

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Figure 1A:
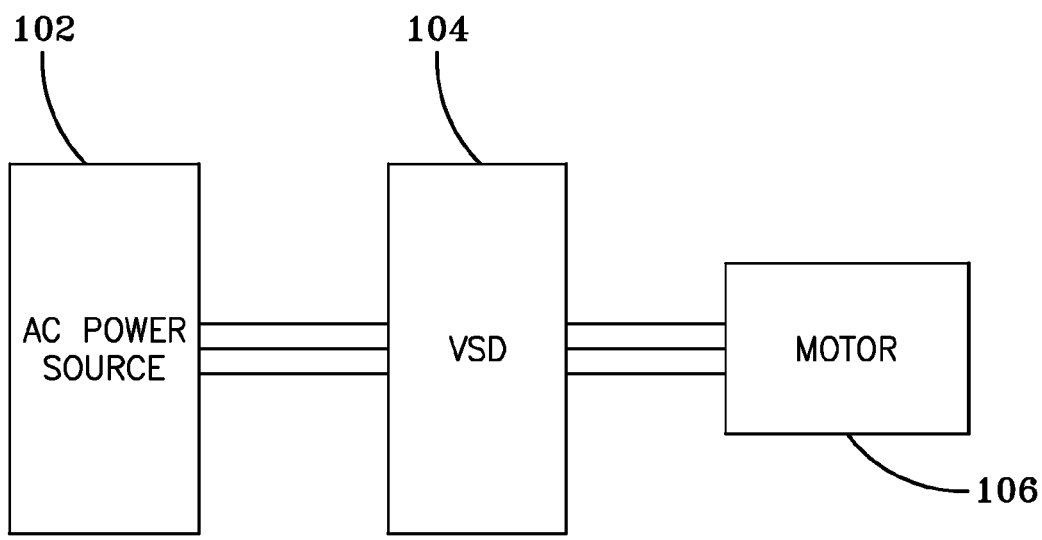
FIGS. 1A and 1B illustrate schematically a general system configuration.
Figure 1B:
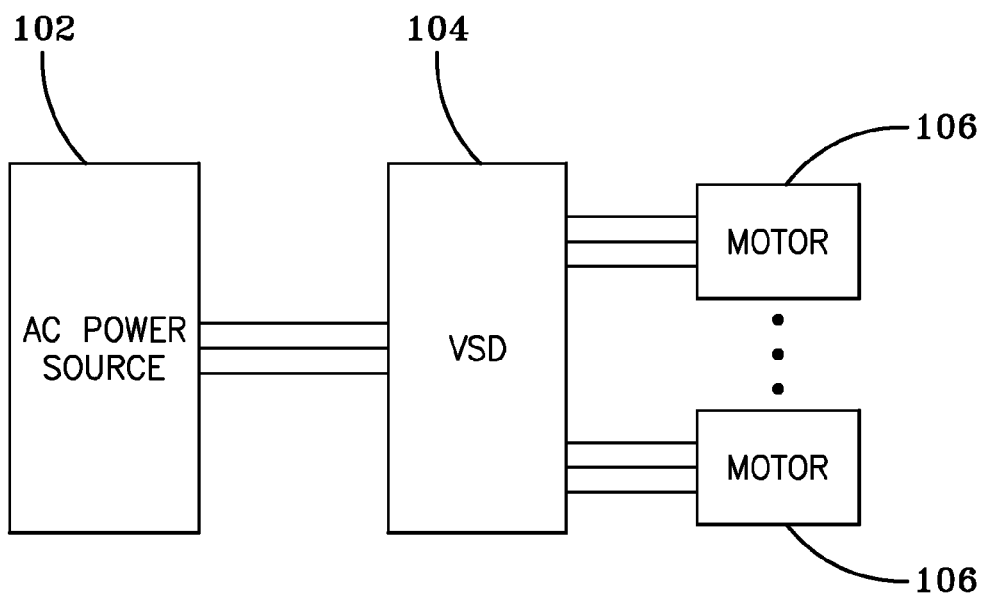

FIGS. 1A and 1B illustrate generally system configurations. An AC power source 102 supplies a variable speed drive (VSD) 104, which powers a motor 106 (see FIG. 1A) or motors 106 (see FIG. 1B). The motor(s) 106 is preferably used to drive a corresponding compressor of a refrigeration or chiller system (see generally, FIG. 3). The AC power source 102 provides single phase or multi-phase (e.g., three phase), fixed voltage, and fixed frequency AC power to the VSD 104 from an AC power grid or distribution system that is present at a site. The AC power source 102 preferably can supply an AC voltage or line voltage of 200 V, 230 V, 380 V, 460 V, or 600 V, at a line frequency of 50 Hz or 60 Hz, to the VSD 104 depending on the corresponding AC power grid.

The VSD 104 receives AC power having a particular fixed line voltage and fixed line frequency from the AC power source 102 and provides AC power to the motor(s) 106 at a desired voltage and desired frequency, both of which can be varied to satisfy particular requirements. Preferably, the VSD 104 can provide AC power to the motor(s) 106 having higher voltages and frequencies and lower voltages and frequencies than the rated voltage and frequency of the motor(s) 106. In another embodiment, the VSD 104 may again provide higher and lower frequencies but only the same or lower voltages than the rated voltage and frequency of the motor(s) 106. The motor(s) 106 is preferably an induction motor, but can include any type of motor that is capable of being operated at variable speeds. The induction motor can have any suitable pole arrangement including two poles, four poles or six poles.

Figure 2A:
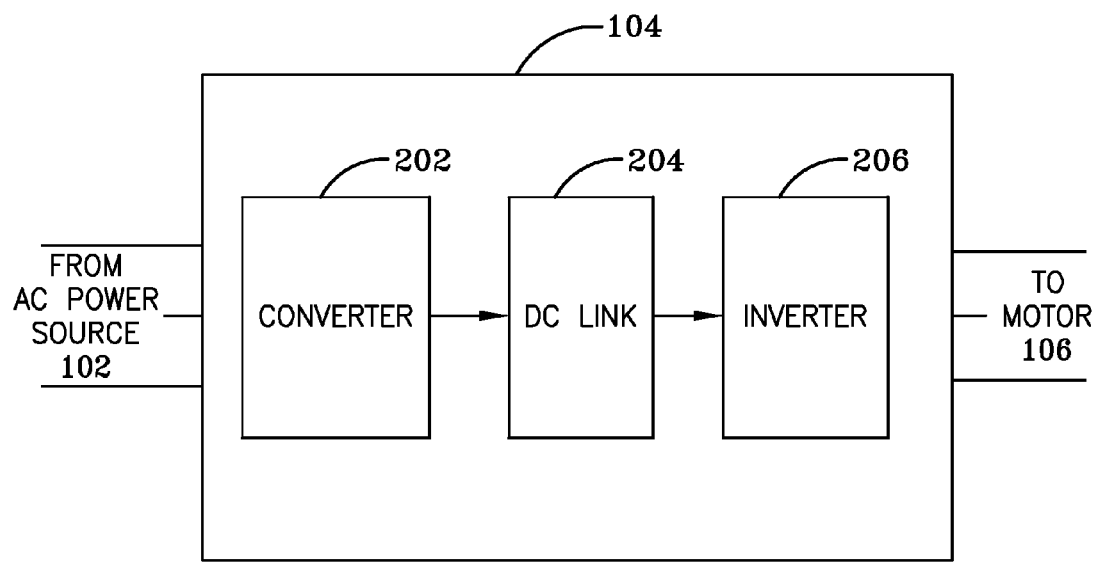
FIGS. 2A and 2B illustrate schematically embodiments of variable speed drives.
Figure 2B:
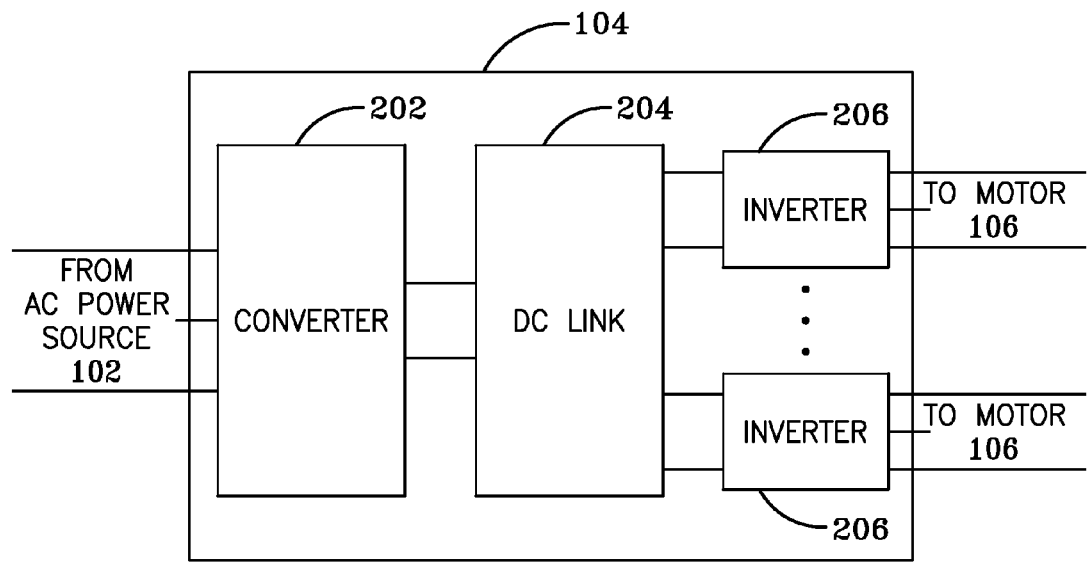

FIGS. 2A and 2B illustrate different embodiments of the VSD 104. The VSD 104 can have three stages: a converter stage 202, a DC link stage 204 and an output stage having one inverter 206 (see FIG. 2A) or a plurality of inverters 206 (see FIG. 2B). The converter 202 converts the fixed line frequency, fixed line voltage AC power from the AC power source 102 into DC power. The DC link 204 filters the DC power from the converter 202 and provides energy storage components. The DC link 204 can be composed of capacitors, inductors, or a combination thereof, which are passive devices that exhibit high reliability rates and very low failure rates. Finally, in the embodiment of FIG. 2A, the inverter 206 converts the DC power from the DC link 204 into variable frequency, variable voltage AC power for the motor 106 and, in the embodiment of FIG. 2B, the inverters 206 are connected in parallel on the DC link 204 and each inverter 206 converts the DC power from the DC link 204 into a variable frequency, variable voltage AC power for a corresponding motor 106. The inverter(s) 206 can be a power module that can include power transistors, insulated gate bipolar transistor (IGBT) power switches and inverse diodes interconnected with wire bond technology. Furthermore, it is to be understood that the DC link 204 and the inverter(s) 206 of the VSD 104 can incorporate different components from those discussed above so long as the DC link 204 and inverter(s) 206 of the VSD 104 can provide the motors 106 with appropriate output voltages and frequencies.

With regard to FIGS. 1B and 2B, the inverters 206 are jointly controlled by a control system such that each inverter 206 provides AC power at the same desired voltage and frequency to corresponding motors based on a common control signal or control instruction provided to each of the inverters 206. In another embodiment, the inverters 206 are individually controlled by a control system to permit each inverter 206 to provide AC power at different desired voltages and frequencies to corresponding motors 106 based on separate control signals or control instructions provided to each inverter 206. This capability permits the inverters 206 of the VSD 104 to more effectively satisfy motor 106 and system demands and loads independent of the requirements of other motors 106 and systems connected to other inverters 206. For example, one inverter 206 can be providing full power to a motor 106, while another inverter 206 is providing half power to another motor 106. The control of the inverters 206 in either embodiment can be by a control panel or other suitable control device.

For each motor 106 to be powered by the VSD 104, there is a corresponding inverter 206 in the output stage of the VSD 104. The number of motors 106 that can be powered by the VSD 104 is dependent upon the number of inverters 206 that are incorporated into the VSD 104. In one embodiment, there can be either 2 or 3 inverters 206 incorporated in the VSD 104 that are connected in parallel to the DC link 204 and used for powering a corresponding motor 106. While the VSD 104 can have between 2 and 3 inverters 206, it is to be understood that more than 3 inverters 206 can be used so long as the DC link 204 can provide and maintain the appropriate DC voltage to each of the inverters 206.

Figure 3:
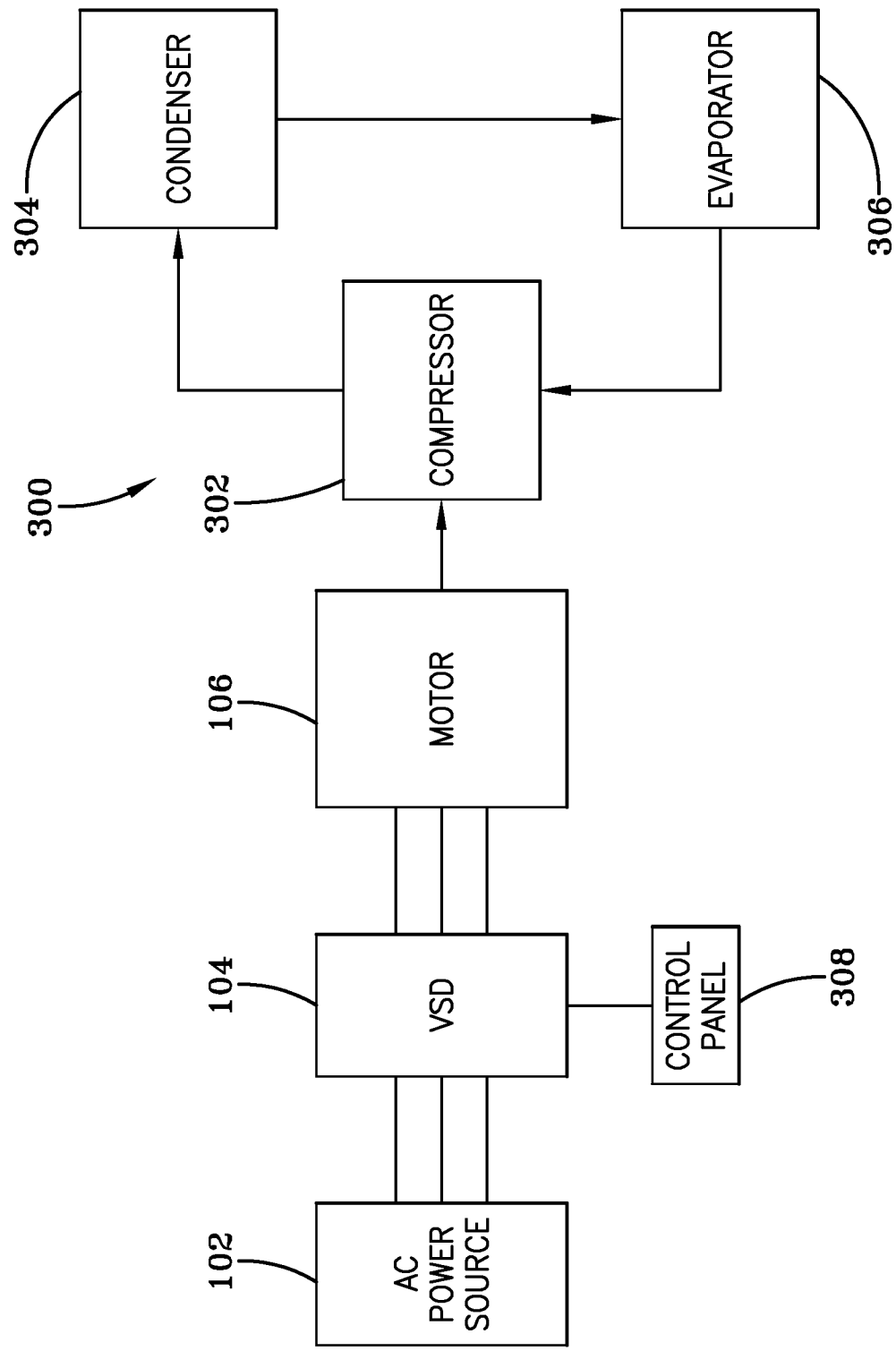
FIG. 3 illustrates schematically a refrigeration system.

FIG. 3 illustrates generally one embodiment of a refrigeration or chiller system using the system configuration and VSD 104 of FIGS. 1A and 2A. As shown in FIG. 3, the HVAC, refrigeration or liquid chiller system 300 includes a compressor 302, a condenser arrangement 304, a liquid chiller or evaporator arrangement 306 and the control panel 308. The compressor 302 is driven by motor 106 that is powered by VSD 104. The VSD 104 receives AC power having a particular fixed line voltage and fixed line frequency from AC power source 102 and provides AC power to the motor 106 at desired voltages and desired frequencies, both of which can be varied to satisfy particular requirements. The control panel 308 can include a variety of different components such as an analog to digital (A/D) converter, a microprocessor, a non-volatile memory, and an interface board, to control operation of the refrigeration system 300. The control panel 308 can also be used to control the operation of the VSD 104, and the motor 106.

Compressor 302 compresses a refrigerant vapor and delivers the vapor to the condenser 304 through a discharge line. The compressor 302 can be any suitable type of compressor, e.g., screw compressor, centrifugal compressor, reciprocating compressor, scroll compressor, etc. The refrigerant vapor delivered by the compressor 302 to the condenser 304 enters into a heat exchange relationship with a fluid, e.g., air or water, and undergoes a phase change to a refrigerant liquid as a result of the heat exchange relationship with the fluid. The condensed liquid refrigerant from condenser 304 flows through an expansion device (not shown) to the evaporator 306.

The evaporator 306 can include connections for a supply line and a return line of a cooling load. A secondary liquid, e.g., water, ethylene, calcium chloride brine or sodium chloride brine, travels into the evaporator 306 via return line and exits the evaporator 306 via supply line. The liquid refrigerant in the evaporator 306 enters into a heat exchange relationship with the secondary liquid to lower the temperature of the secondary liquid. The refrigerant liquid in the evaporator 306 undergoes a phase change to a refrigerant vapor as a result of the heat exchange relationship with the secondary liquid. The vapor refrigerant in the evaporator 306 exits the evaporator 306 and returns to the compressor 302 by a suction line to complete the cycle. It is to be understood that any suitable configuration of condenser 304 and evaporator 306 can be used in the system 300, provided that the appropriate phase change of the refrigerant in the condenser 304 and evaporator 306 is obtained.

The HVAC, refrigeration or liquid chiller system 300 can include many other features that are not shown in FIG. 3. These features have been purposely omitted to simplify the drawing for ease of illustration. Furthermore, while FIG. 3 illustrates the HVAC, refrigeration or liquid chiller system 300 as having one compressor connected in a single refrigerant circuit, it is to be understood that the system 300 can have multiple compressors, powered by a single VSD as shown in FIGS. 1B and 2B or multiple VSDs, see generally, the embodiment shown in FIGS. 1A and 2A, connected into each of one or more refrigerant circuits.

Figure 4:
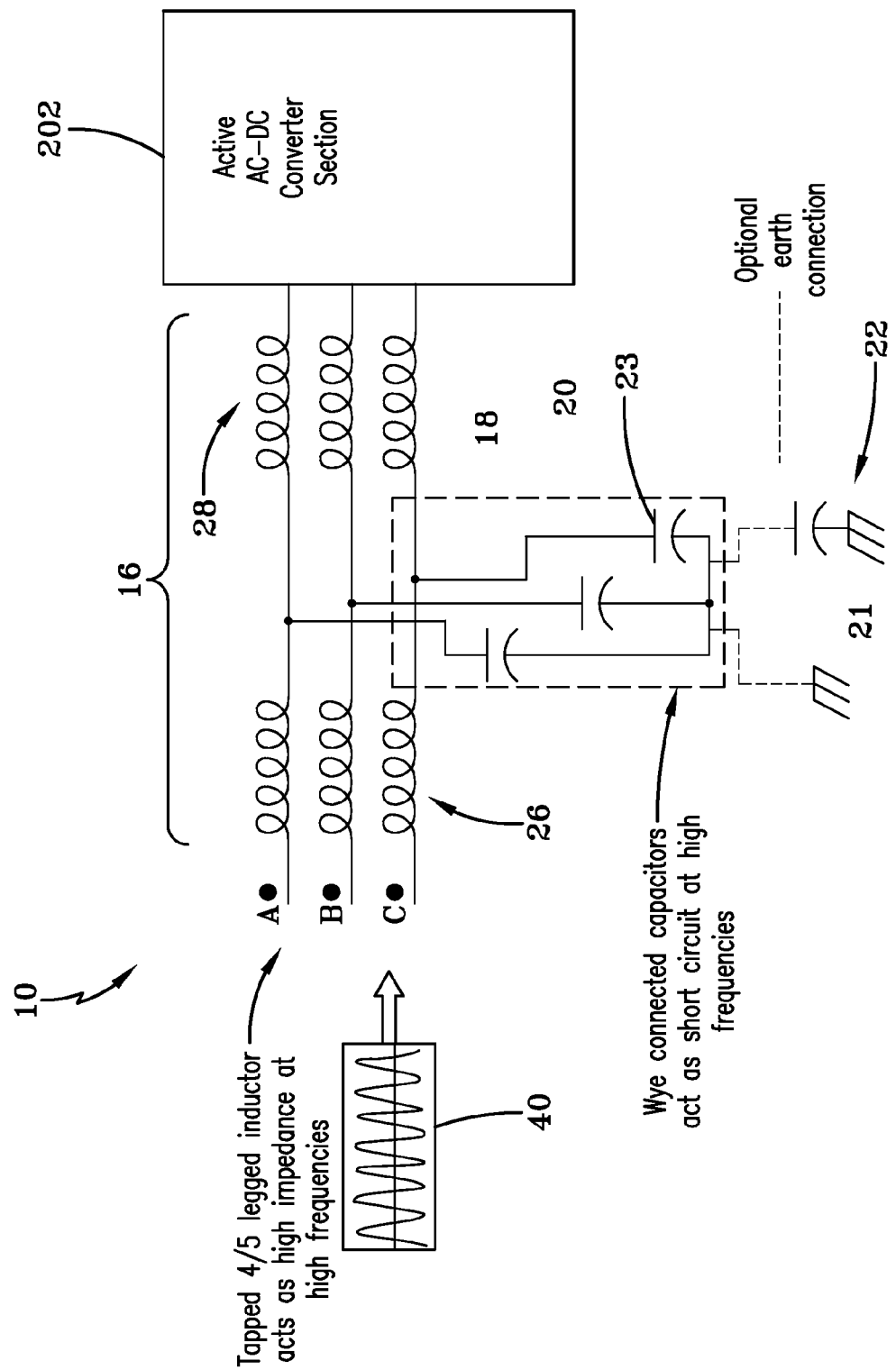
FIG. 4 illustrates a schematic diagram of elements of a common mode and differential mode input filter using a four- or five-legged inductor.

Referring next to FIG. 4, there is a schematic diagram of elements of an input filter 10 shown. EMI/RFI sources generated by the Active Converter 202 are filtered ahead of the converter 202 by splitting a three-phase AC input inductor 16 into a line-side inductor 26 and load-side inductor 28 per phase. The line-side inductors 26 and load-side inductors 28 are connected by inductor tap portions 18. A capacitive three-phase filter element 20 is wye-connected between the inductor tap portions 18. An optional earth connection 22 may be connected to a common point 21 of the wye-connected filter element 20. The earth connection 22 may alternately include a grounding capacitor 23. The line- and load-side inductors 26 and 28, respectively, and the capacitive filter element 20 are designed with inductance and capacitance values to provide a roll off of the EMI/RFI sources—i.e., high frequency switching components of the input current conducted by the converter 202. The input filter provides a high impedance via the differential mode inductive components of inductances 26 and 28 and a low impedance via the three-phase wye connected capacitance 20 to the EMI/RFI sources, while passing the fundamental component of the power current, e.g., 60 Hz, through the network with minimal impedance. By utilizing a four- or five-legged (4/5) input inductor 16, a common mode inductive component is formed via inductances 26 and 28 and together with the optional earth connection 22 or the grounding capacitor 23, increases to the capacity of the filter 10 acts to prevent common mode current generated by the converter 202 from flowing into the mains power source 102. The wye-connection point 21 of the input filter 10 may be directly earthed or alternately earthed through a separate capacitor 23 to provide greater shunting of high-frequency currents to earth. In one embodiment, the inductor 16 may be provided with low inter-winding capacitance.

Line-side inductors 26 provide impedance at a predetermined switching frequency of the VSD 104 between the wye-connected capacitors 20 and the AC power source 102. The impedance of the line-side inductors 26 is designed to allow the wye-connected capacitors 20 to be more effective than a system with no significant impedance between the input AC mains 102 and the VSD 104. Inductors 26 also provide high-frequency impedance in the reverse direction, to restrict the flow of high-frequency current from the converter 202 to the AC power source 102. Thus the inductors 26 restrict or limit high frequency emissions from reflecting back to the AC power source 102.

Inductors 28 provide impedance between the capacitors 20 and the input to the VSD 104. Inductors 28 provide high impedance between the AC power source 102 and the active converter 202 portion of the VSD 104. Alternately, if the VSD 104 is a conventional VSD with a passive rectifier converter, the impedance of inductor 28 isolates the VSD 104 from the input AC mains 102 and reduces high frequency emissions conducted to the mains 102 from the VSD 104.

The wye-connected capacitor bank 20 provides low impedance between phase conductors A, B & C for at least one switching frequency of the VSD 104, and provides low impedance for differential mode current flow. The wye-connected capacitor bank 20 also provides a low impedance path for flow of at least one switching frequency to an earth ground connection 22, assuming that an earth ground connection is provided, for reducing common mode current flow.

Figure 5:
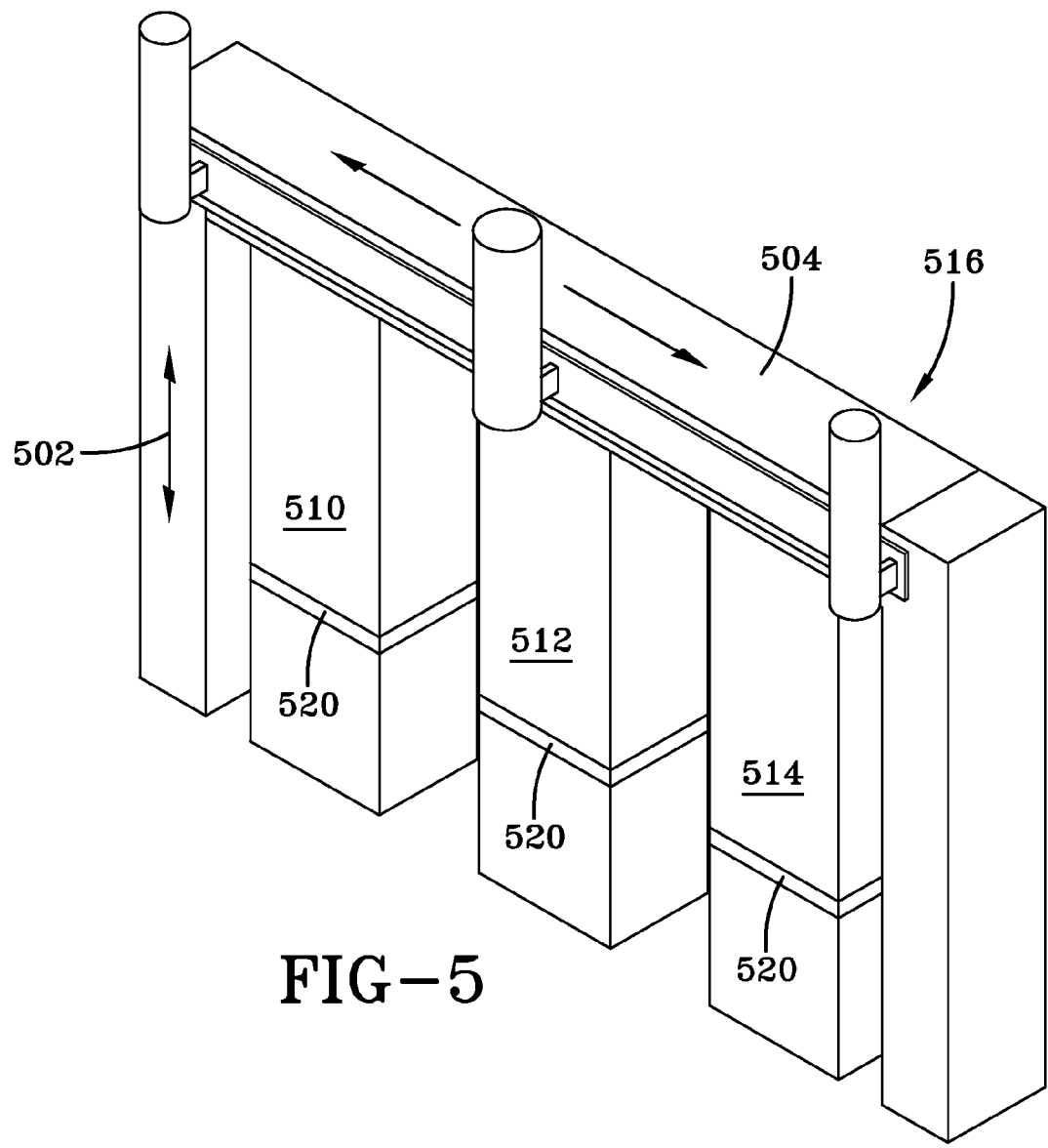
FIG. 5 illustrates a one-quarter section view of a five-legged inductor core.
Figure 6:
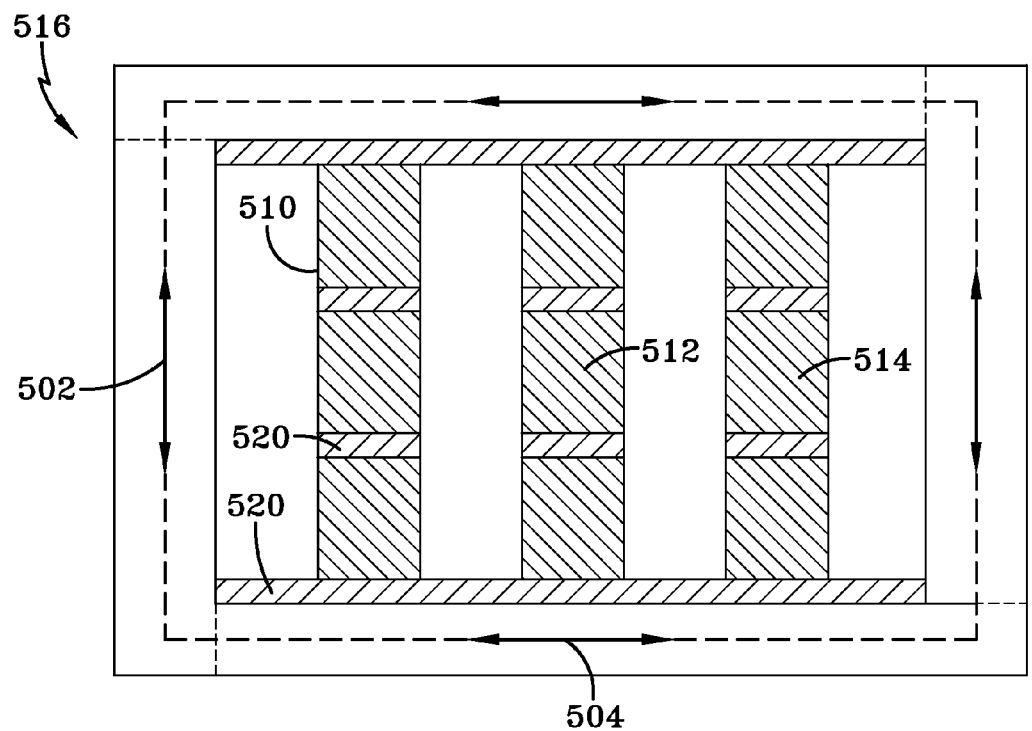
FIG. 6 illustrates a full sectional view of the five-legged inductor core.
Figure 8:
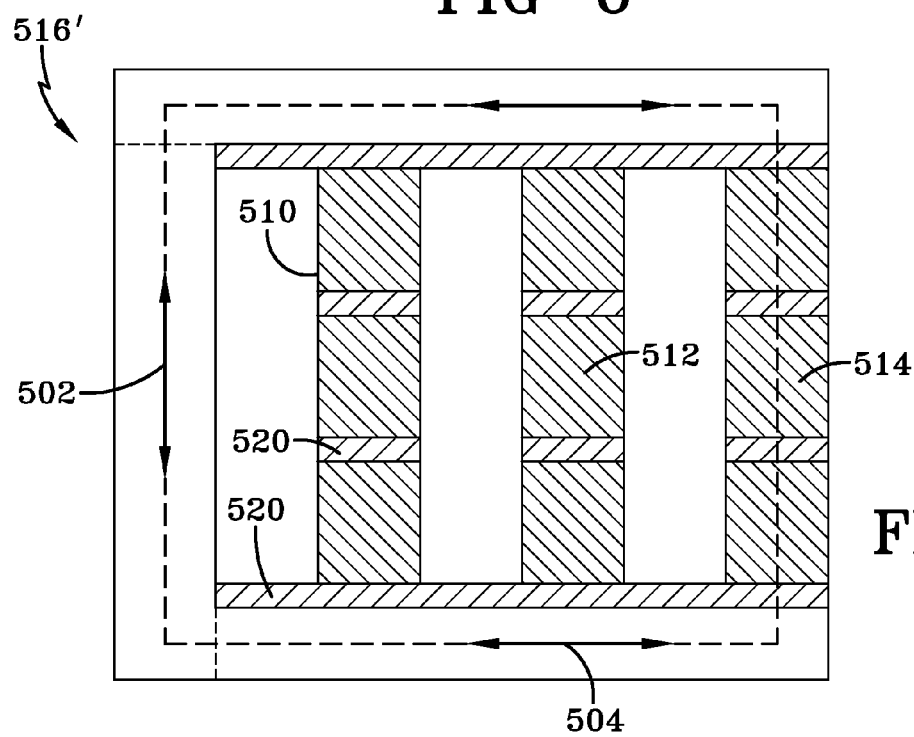
FIG. 8 illustrates a full sectional view of the four-legged inductor core.

Referring next to FIGS. 5 and 6, in one embodiment the common mode input filter 10 may be implemented using either a four-legged AC inductor 516' (see, e.g., FIG. 8, the four-legged inductor embodiment designated by a prime symbol) or five-legged AC inductor 516 (collectively referred to as 4/5 inductor) applied to the input of the VSD 104 with Active Converter technology. Conventional filters employ three-legged inductors to provide power factor and harmonic input current control. The 4/5 inductor 516 provides both common mode and differential mode inductance. FIGS. 5 and 6 illustrate a five-legged inductor 516, which provides more geometric symmetry in a three-phase power system. The common mode inductance is generated by providing a magnetic flux path 504, indicated by arrow 502. The flux path 504, in magnetic communication with three core legs 510, 512 and 514, each of which are connected to one of the phases in the three phase input power 102. The flux path is a continuous, magnetically permeable magnetic loop that surrounds the inner three core legs 510, 512 and 514. Each of the core legs 510, 512 and 514 is has a coil winding or conductor 26 (see, e.g., FIG. 4) wrapped around substantially the entire surface area of the respective core leg 510, 512 and 514. The direction of the magnetic flux in the flux path are dependent upon the direction and magnitude of the currents in coil windings, and are therefore shown as flowing in either direction, although in practice, the magnetic flux may flow in one direction or another about the about the periphery of the inductor 516. The common mode magnetic flux is induced by electrical currents that are common to all three inductor coils 16. This common flux path 504 can only be excited by common mode current components flowing through the inductor coils. A picture of the cross section of such an inductor is shown in FIG. 5. This inductor 516 has a liquid-cooled core to improved heat dissipation and increase the power capacity of the inductor 516.

Referring to FIG. 6, an elevational cross-section of the five-legged inductor 516 illustrates air gaps 520 that are inserted in the legs 510, 512 and 514, to prevent core saturation and increase the working flux density range of the inductor 516. In the inductor 516, an air gap 520 is arranged between the horizontal sections of the flux path 504. Two air gaps 520 are also inserted intermediately in each of the core legs 510, 512 and 514, to break up each core leg 510, 512 and 514, into three discrete segments. Other air gap configurations may be used to achieve the same result.

Figure 7:
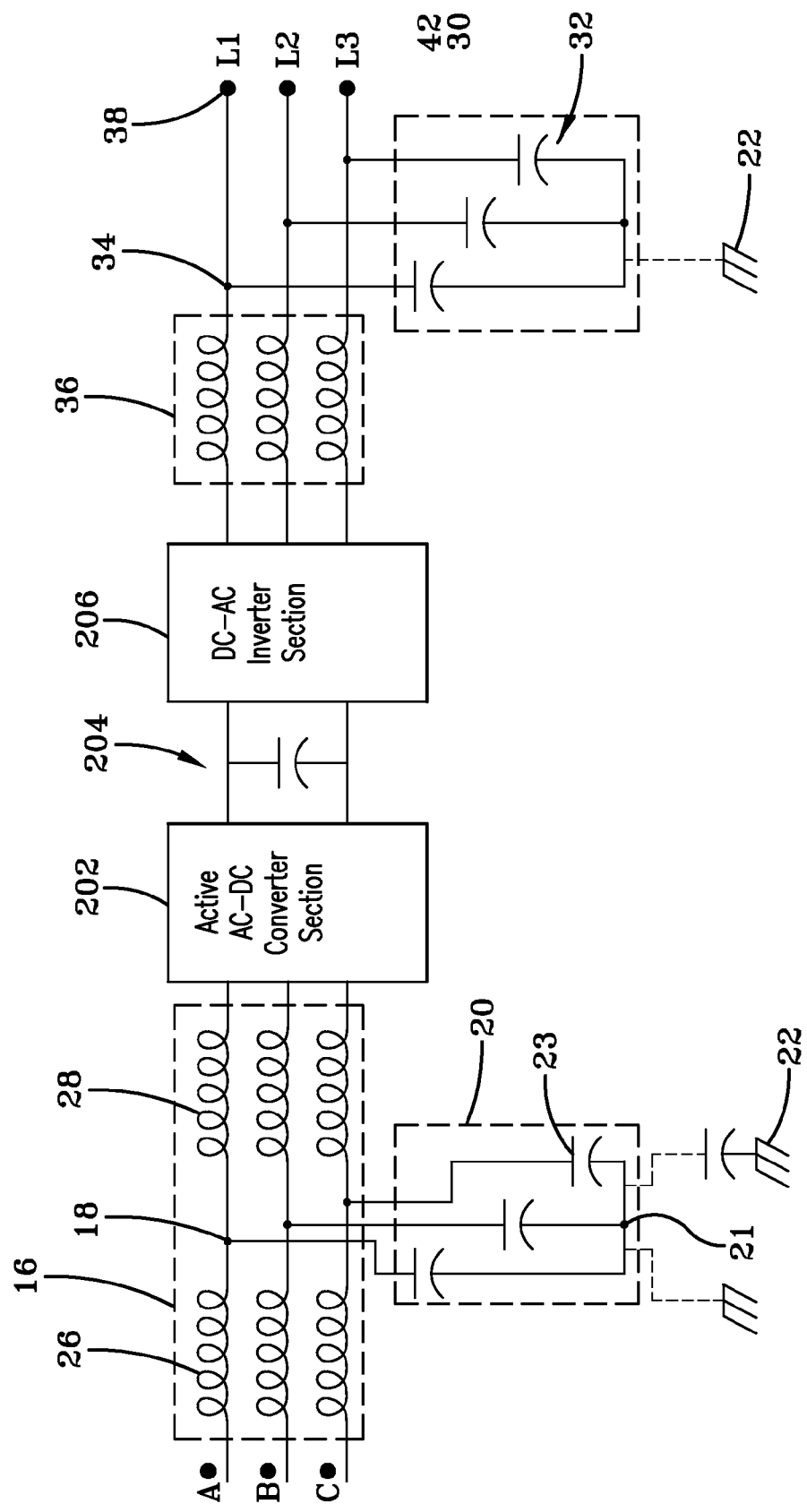
FIG. 7 illustrates a schematic circuit diagram of an alternate embodiment including the VSD output filter configuration.

Referring next to FIG. 7, an embodiment of a variable speed drive having an output filter with common mode/differential mode input filter circuit is illustrated. The EMI/RFI input filter as described with respect to FIG. 4, above, is connected at the input of the converter 202, and performs the same filtering functions as described above. The addition of the input filter with an inductor 16 at the input to the VSD 104 effectively provides a high-impedance circuit between the AC power mains 102 and the VSD 104. To provide a low impedance path for common mode current flow, a three-phase wye connected capacitor bank 30 including three common mode capacitors 32 are connected between the VSD's motor connection terminal 38, and earth ground 22. The capacitor bank 30 is equivalent to a short circuit—i.e., low impedance—at high frequency, effectively earthing the destructive high frequency AC components present on the three VSD output terminals 34 and shunting the destructive AC components from reaching the motor or other type of load connected to the VSD, thus filtering out currents resulting from common mode voltages. The capacitor bank 30 allows high-frequency AC components to bypass the parasitic capacitive earthing elements of the motor and eliminates bearing damage caused by common mode voltages and currents.

The inverter output terminals 34 feed a second filter arrangement that includes a three phase inductor 36 connected in series with the output terminals 38, which are connected to the system load, e.g., a motor 106. A second three-phase capacitor bank 42 is wye-connected to the output power phases, L1, L2 and L3, between the load side of the three phase inductor 36, providing a low impedance path for the differential mode current to flow among the capacitor bank 42. The combination of the second three-phase capacitor bank wye-connected at the load side of the three phase inductor 36 provides an L-C differential mode output filter. By combining the common mode filter capacitor bank 30, with the L-C differential mode inductor 36 and capacitor bank 42, both of the destructive conditions, i.e., common mode and differential mode currents, are prevented from reaching a load that is powered by the VSD 104.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the common mode and differential mode filter for variable speed drives, as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. An input filter for filtering common mode and differential mode currents, comprising:
   a three-phase inductor having three windings, wherein each winding of the three-phase inductor having a center tap dividing each winding into a pair of inductor sections; and
   a three-phase input capacitor bank having three capacitors connected in a wye configuration to the three center taps at one end, and to a common point at the opposite end;
   wherein the three-phase input capacitor bank is configured to provide a short circuit for frequencies above a predetermined fundamental frequency for shunting frequencies above a predetermined fundamental frequency through the three phase capacitor bank, while passing the predetermined fundamental frequency to an input AC power source.

2. The input filter of claim 1, further comprising: the common point at the opposite end of three-phase input capacitor bank also having a connection to earth ground.

3. The input filter of claim 2, further comprising: a capacitor connected between common point and earth ground.

4. The input filter of claim 2, wherein each of the pairs of inductor sections comprises a line side inductor and a load side inductor being each connected at one end to the center tap, wherein the line side inductor being connected to an AC power source at a second end opposite the center tap, and the load side conductor being connected to a converter stage of the variable speed drive at a second end opposite the center tap.

5. The input filter of claim 2, wherein the three-phase inductor is a five legged inductor comprising:
a core element having at least three leg portions, each leg portion being wound with a pair of electric current carrying coils, and a flux portion, the flux portion connecting the three leg portions in a continuous magnetic path, the flux portion having a pair of vertical legs connected at a top end by a top leg and at a bottom end by a bottom leg to form a substantially rectangular frame portion, the three leg portions being disposed within and in magnetic communication with the frame portion.

6. The input filter of claim 2, wherein the three phase inductor is a four legged conductor, comprising:
a core element having at least three leg portions, each leg portion being wound with a pair of electrical coils, and a flux portion, the flux portion connecting the three leg portions in a continuous magnetic path, the flux portion providing a common flux path, the flux path being excited by common mode current components flowing through the electrical coils.

7. The input filter of claim 1, wherein the input filter is connected between an AC power source and a converter, the converter being configured to convert the input AC voltage to a boosted DC voltage, a DC link connected to the converter, the DC link being configured to filter and store the boosted DC voltage from the converter; and an inverter stage connected to the DC link, the inverter stage being configured to convert the boosted DC voltage from the DC link into an output AC power having a variable voltage and a variable frequency.

8. The input filter of claim 7, wherein:
the inverter is connected to a first output capacitor bank of three capacitors, each capacitor connected in a wye configuration to an output phase of the inductor;
each of the three capacitors of the first output capacitor bank being connected in common at an end opposite the output phase connection; the common capacitor connection also being connected to earth.

9. The input filter of claim 8, further comprising:
an output inductor having three output phase windings connected in series with the output phase of the inverter stage; and
a second output capacitor bank of three capacitors, each capacitor of the second output capacitor bank being connected in a wye configuration to a load side of the output inductor;
wherein currents induced by differential mode voltage components are removed from the load side of the output inductor and prevented from flowing to a load connected to the output inductor.

* * * * *